United States Patent [19]

Marpoe, Jr.

[11] Patent Number: 4,516,072
[45] Date of Patent: May 7, 1985

[54] DEVICE FOR USE IN TESTING PRINTED CIRCUIT BOARD COMPONENTS

[75] Inventor: Gary R. Marpoe, Jr., Hummelstown, Pa.

[73] Assignee: AMP Incorporated, Harrisburg, Pa.

[21] Appl. No.: 443,358

[22] Filed: Nov. 22, 1982

[51] Int. Cl.³ ............................................. G01R 31/02
[52] U.S. Cl. ........................... 324/158 F; 324/73 PC; 339/17 F
[58] Field of Search ............ 324/158 F, 73 PC, 158 P, 324/72.5; 339/17 CF, 17 F, 17 T, 17 LC, 17 L, 176 MF

[56] References Cited

U.S. PATENT DOCUMENTS

| | | | |
|---|---|---|---|
| 3,696,319 | 10/1972 | Olsson | 339/17 LC X |
| 3,702,439 | 11/1972 | McGahey et al. | 324/72.5 X |
| 3,803,709 | 4/1974 | Beltz et al. | 29/624 |
| 3,810,016 | 5/1974 | Chayka et al. | 324/72.5 X |
| 4,340,860 | 7/1982 | Teeple, Jr. | 324/158 F |

OTHER PUBLICATIONS

IBM Technical Disclosure Bulletin, Jeenicke, E. et al., "Microcircuitry Test Probe", vol. 12, No. 9, Feb. 1970, pp. 1435,1436.

Schelhorn, R. L.; "Test Fixture for Testing Chip Carrier Devices Assembled in Larger Ckts."; RCA Tech. Notes; Oct. 12, 1982.

Primary Examiner—Stewart J. Levy
Assistant Examiner—Stephen M. Baker
Attorney, Agent, or Firm—Allan B. Osborne

[57] ABSTRACT

The present invention relates to a device used in testing and analyzing a printed circuit board and further for determining optimum chip functionality. More particularly, the device includes a rigid plate to which four flat flexible film strips are attached such that upon mounting the plate in a connector on the board, the traces on the film are in electrical contact with traces and electronic devices on the board through the contact elements in the connector. The other ends of the four film strips may be terminated to any variety of connectors to carry the electrical signals to testing and analyzing equipment.

2 Claims, 5 Drawing Figures

DEVICE FOR USE IN TESTING PRINTED CIRCUIT BOARD COMPONENTS

BACKGROUND OF THE INVENTION

1. Field of the Invention

The invention disclosed herein relates to devices for testing in-service printed circuit boards to locate trace faults and the like and to test and analyze electronic components mounted on such circuit boards.

2. Prior Art

Prior to the advent of leadless electronic substrates, DIP headers and DIPs were predominately used on circuit boards. Board faults were located by removing a DIP and plugging in a pseudo-DIP electrically wired to diagnostic instruments. Such devices are not usable with leadless, active device substrate connectors however, and as leadless electronic components are becoming more popular, a need exists for a testing device which can be plugged into such connectors.

SUMMARY OF THE PRESENT INVENTION

The present invention is intended to provide a printed circuit board testing device which can be mounted in a leadless electronic substrate connector assembly mounted on the board. More particularly, the device includes a rigid plate having the dimensions of a substrate for which the connector was designated. Four, flat flexible film strips are attached to the under side of the plate so that upon placing the assembly in the connector, the traces on the film strips engage the contact elements therein. The other ends of the film strips may be connected to diagnostic instruments or the like.

DESCRIPTION OF THE INVENTION

Figure 1:
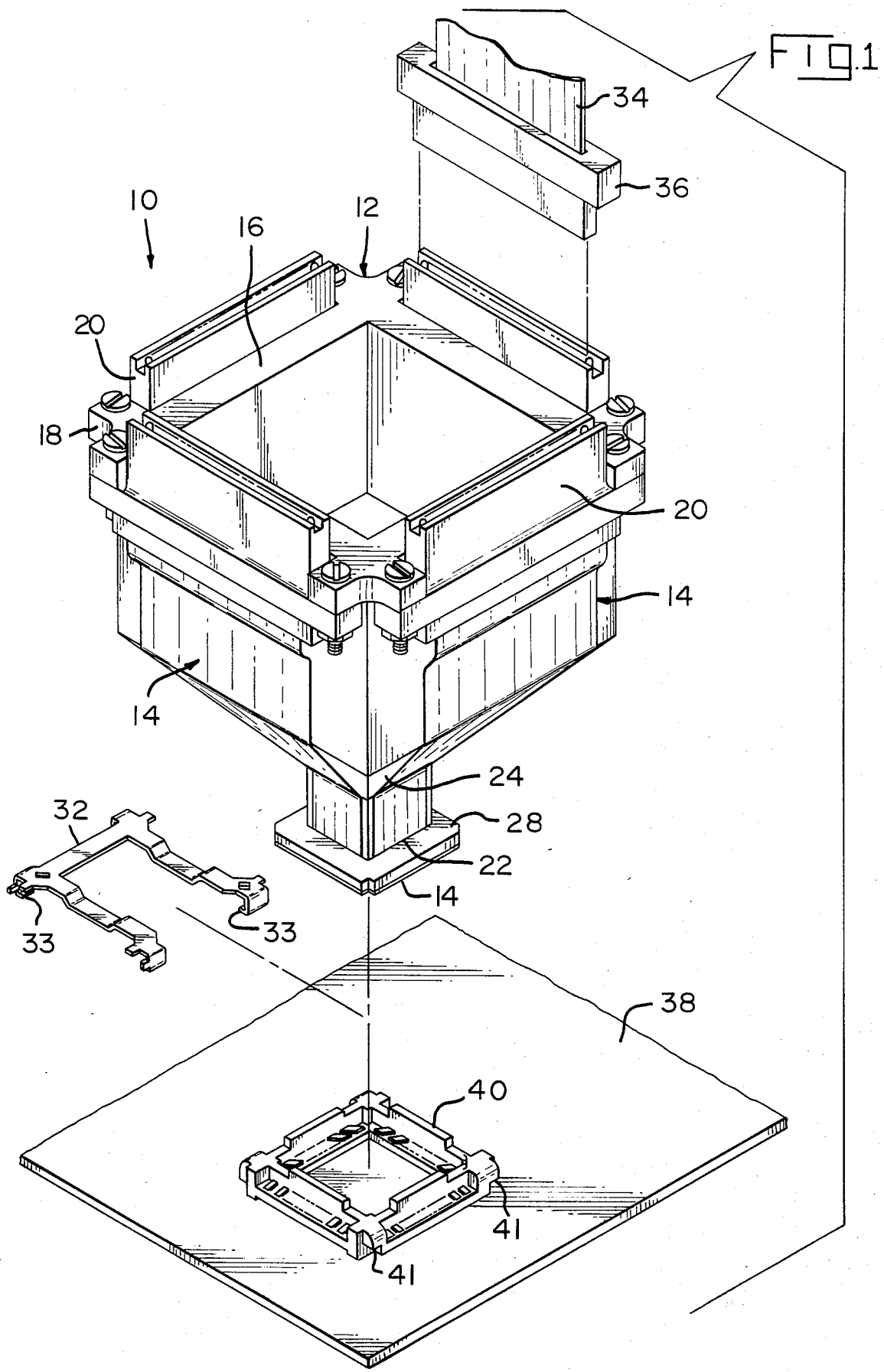
FIG. 1 is an isometric view of the testing device of the present invention.

With reference to FIG. 1, testing device 10, constructed in accordance with the present invention, includes a rigid housing 12 which provides support for four, flat flexible film strips 14. Means for mounting flexible film connectors may be provided on upper end 16 of the housing. The mounting means employed on the illustrated housing are ears 18 to which flexible film connectors 20 can be bolted as shown.

Lower end 22 of housing 16 is substantially smaller in size relative to the upper end. Beveled surfaces 24 extend between and join the two ends. The upper portion of the housing is hollow while the lower end is solid. A preferred material for making the housing is polypropylene.

Film strips 14 are conventional flexible film having conductive traces 26 (FIG. 2) on one side.

Figure 3:
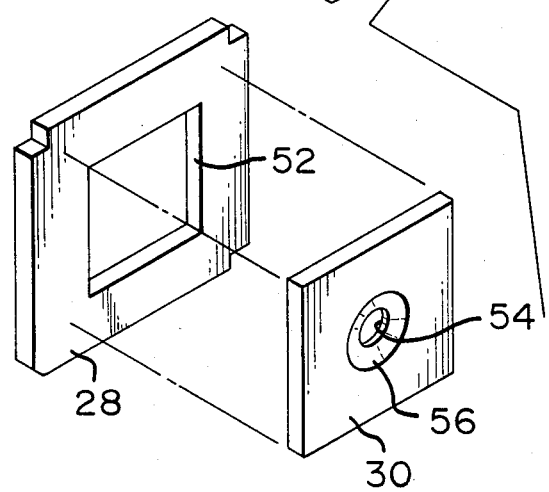
FIG. 3 illustrates additional components of the testing device.

Other components of the testing device include plate 28, end cap 30, both of which are shown more clearly in FIG. 3, and cover 32. Latch fingers 33 are provided on each corner of the cover.

Also shown in FIG. 1 is a film strip 34 terminated in connector 36 which plugs into a connector 20 on device 10. Strip 34 leads to equipment (not shown) which analyzes electronic devices (not shown) mounted on printed circuit board 38 and/or tests circuits on the board itself. Active device substrate connector 40, mounted on board 38, and device 10 which loads into connector 40 (FIG. 5) are the conduits for the electrical signals traveling to the analyzing equipment. Downwardly facing shoulders 41 are provided on each corner of connector 40.

Figure 2:
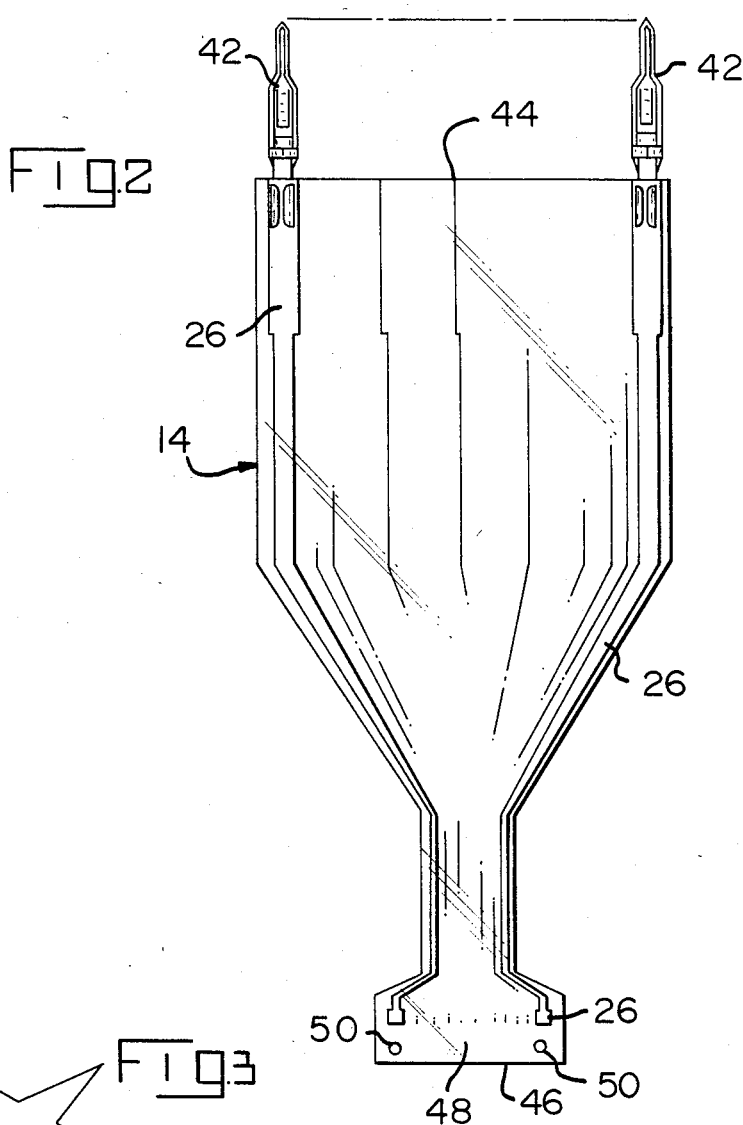
FIG. 2 is a view of a flat flexible film utilized in the testing device.

FIG. 2 is a drawing of one film strip 12 before being secured to plate 28 and being loaded into connector 20. Terminals 42, which are received and retained in connectors 20, are crimped to conductive traces 26 at wide end 44. Opposite end 46 of the strip includes leader 48 on which preferrably traces 26 are omitted. Holes 50 are provided through the leader adjacent each side thereof. The width of the strip generally matches that of a side of housing 12 with end 46 flaring out to about the length of one side of plate 28.

The aforementioned plate 28 is shown isometrically in FIG. 3 to which reference is now made. Preferrably the plate, which has substantially the same dimensions as an active device substrate (not shown) which fits into connector 40, is made from nickel and heat treated. A central opening 52 is provided through the plate. Notches at three corners and a fourth beveled corner orientate the plate in connector 40.

End cap 30, also shown isometrically in FIG. 3, is made from G-10 plastic and has a hole 54 therethrough. The area surrounding the hole on one side is tapered or disked in as indicated by reference numeral 56.

The most difficult and important task in assembling device 10 from the described components is that of securing film strips 14 to plate 28. A jig (not shown) aids considerably in this job. The jig consists of a base with upright posts thereon. Centrally three such posts are provided in a pattern with the spacing and location corresponding to the three corner notches on plate 28. The plate, positioned on the base with the posts extending up through the notches, is restrained against horizontal motion. Two additional posts are provided spaced outwardly from each side of the plate location. Holes 50 on film strips 14 are positioned on these posts.

Figure 4:
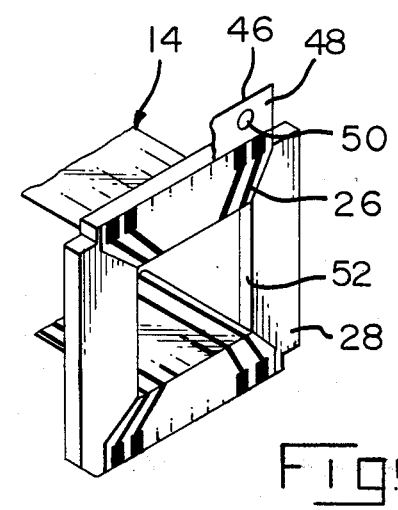
FIG. 4 illustrates a flexible film strip attached to a rigid plate.

The first step begins with threading ends 46 of all four film strips through opening 52 in plate 28. Two strips are so shown in FIG. 4. With each film strip end covering one of the four sides defined by the central opening, the plate is carefully placed down on the base between the three posts. Leader 48 on each strip end 46 is adjusted down onto the aforementioned pair of posts spaced out from each plate side. The conductive traces 26 are facing away from the plate as shown in FIG. 4. Plate 28 is then carefully lifted up a short distance and adhesive applied to the surfaces against which film strips 14 bear. The plate is then replaced down against the strips and held in place until the adhesive cures and the film strip ends are secured to the plate sides. Leaders 48 are cut off and the sub-assembly removed from the jig. As shown in FIG. 4, the trace pads on the film strips are located immediately adjacent the edge of the plate sides.

Terminals 42 on each strip 14 are now loaded into a connector 20.

Figure 5:
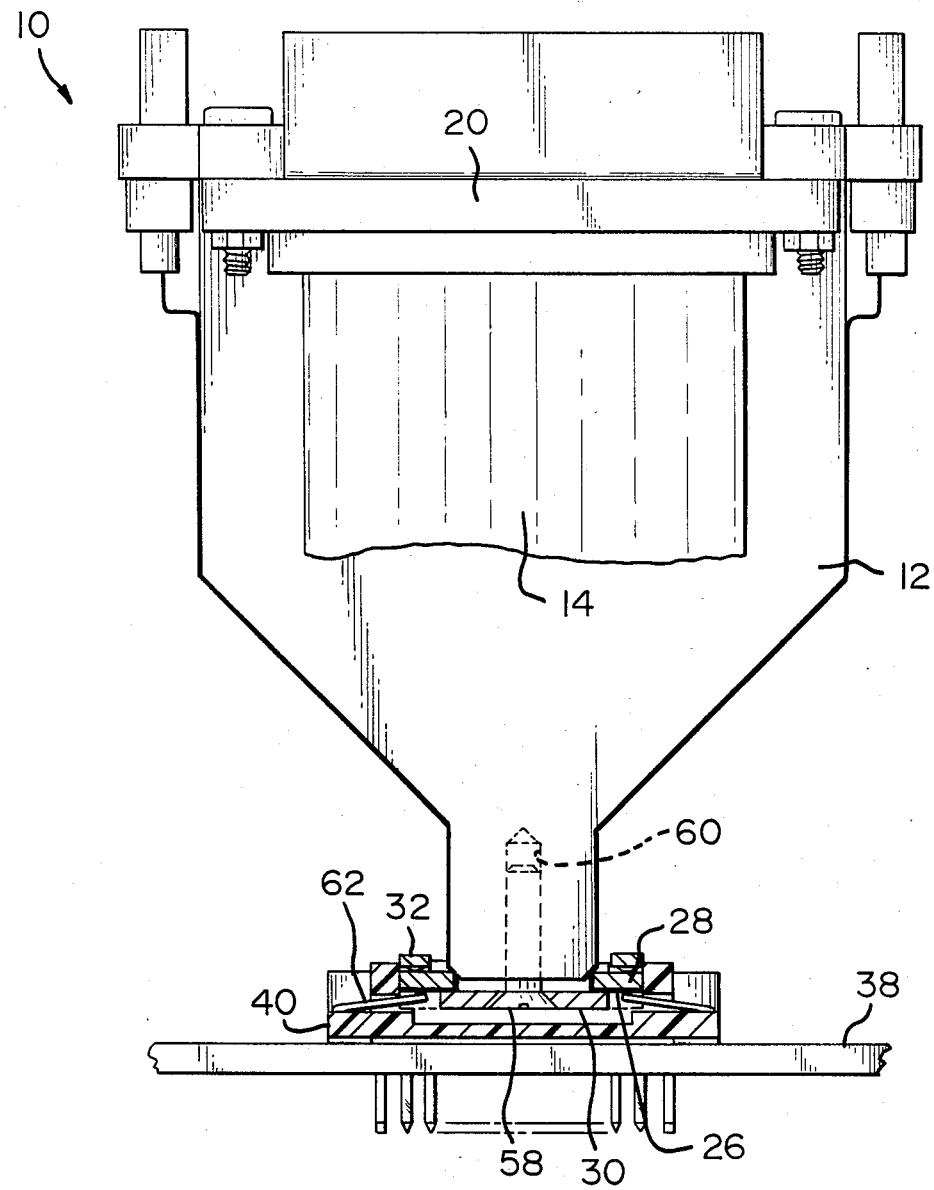
FIG. 5 is a side view, partially sectioned, showing the testing device of FIG. 1 mounted in a connector on a circuit board.

Holding the four strips so that the plate and attached strip ends 46 hang down, housing 12 is carefully placed therebetween to where the plate 28 abuts the face of small end 22. Connectors 20 are fastened to the mounting means and end cap 30 placed over plate 28 and secured to housing 12 by means of screw 58, positioned in hole 54, being threadedly received into threaded aperture 60 in housing 12 as seen in FIG. 5. The device is assembled as shown in FIGS. 1 and 5.

FIG. 5 shows the device positioned in connector 40 on board 38 and held therein by cover 32. The cover slides on over plate 28 and fingers 33 on the cover catch on downwardly facing shoulders 41 on the connector. Traces 26 now bear against contact elements 62 seen in the cut-away view of FIG. 5.

I claim:

1. A device for use in testing and analyzing circuits and electronic components on a printed circuit board and used in conjunction with an active device substrate connector mounted on the board and having a recess with contact elements therein, said device comprising:

a. an elongated housing having flexible film strip connectors at one end and plate attachment means at the other end;
   b. a plate for being received in the recess in the connector and attached to the other end of the housing and having four sides defined by a central opening; and
   c. four flexible film strips having conductive traces thereon extending from one end to another, one end of the film strips being terminated in the connectors at one end of the housing and the other ends being secured to the sides of the plate with the conductive traces facing away from the plate and housing so that with the plate positioned in the recess, the conductive traces on the film strips engage the contact elements to transmit signals from the board to testing and analyzing equipment which may be connected to the film strip connectors.

2. The device of claim 1 further including means for removably retaining the plate in the recess in the connector mounted on the board.

* * * * *